(12) United States Patent
Cao

(10) Patent No.: US 11,289,514 B2
(45) Date of Patent: Mar. 29, 2022

(54) TFT ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Wu Cao, Shenzhen (CN)

(*) Notice: Subject to any disclaimer, the term of this patent is extended or adjusted under 35 U.S.C. 154(b) by 289 days.

(21) Appl. No.: 16/638,139

(22) PCT Filed: Dec. 20, 2019

(86) PCT No.: PCT/CN2019/127027
§ 371 (c)(1),
(2) Date: Feb. 11, 2020

(87) PCT Pub. No.: WO2021/114377
PCT Pub. Date: Jun. 17, 2021

(65) Prior Publication Data
US 2021/0408071 A1 Dec. 30, 2021

(30) Foreign Application Priority Data

Dec. 11, 2019 (CN) .......................... 201911266374.7

(51) Int. Cl.
*H01L 27/12* (2006.01)
*G02F 1/1362* (2006.01)
*G02F 1/1368* (2006.01)

(52) U.S. Cl.
CPC ........ *H01L 27/1225* (2013.01); *G02F 1/1368* (2013.01); *G02F 1/136222* (2021.01); *G02F 1/136286* (2013.01); *H01L 27/1244* (2013.01)

(58) Field of Classification Search
CPC ............. H01L 27/1225; H01L 27/1244; G02F 1/136222; G02F 1/136286; G02F 1/1368
USPC .......................................................... 257/59
See application file for complete search history.

(56) References Cited

U.S. PATENT DOCUMENTS

| 10,163,935 B2 * | 12/2018 | Cheng ............... H01L 29/42384 |
| 2009/0114917 A1 * | 5/2009 | Yamazaki ............... H01L 29/04 257/59 |
| 2021/0226065 A1 * | 7/2021 | Cao .................... H01L 29/66742 |

* cited by examiner

*Primary Examiner* — David Vu
*Assistant Examiner* — Brandon C Fox

(57) ABSTRACT

The present application discloses a thin-film transistor (TFT) array substrate and a display panel. The TFT array substrate includes an active layer and a source/drain electrode disposed on the active layer. The active layer includes an electrode coverage region, a channel region, and a first peripheral region disposed around the electrode coverage region and the channel region. The active layer located in the first peripheral region is distributed in multi-sections.

20 Claims, 7 Drawing Sheets

TFT ARRAY SUBSTRATE AND DISPLAY PANEL

CROSS-REFERENCE TO RELATED APPLICATIONS

This application claims the priority to Chinese Patent Application No. 201911266374.7, entitled "TFT ARRAY SUBSTRATE AND DISPLAY PANEL" and filed on Dec. 11, 2019 with the State Intellectual Property Office of the People's Republic of China, which is entirely incorporated by reference into the present application.

FIELD OF APPLICATION

The present application is related to the field of display technology, and specifically to a thin-film transistor (TFT) array substrate and a display panel.

BACKGROUND OF APPLICATION

Generally, thin-film transistors (TFTs) are used as driving elements of display panels. Active layers in TFTs generate photo-generated carriers after being irradiated with light, which causes crosstalk and afterimages and affects quality of displayed images of the display panels.

An array substrate including TFTs can be manufactured by a four-mask process or a five-mask process. In the five-mask process, a semiconductor layer (active layer) and a source/drain electrode are separately formed by different masks. Considering an alignment yield when the source/drain electrode is stacked with the semiconductor layer, a pattern of the semiconductor layer is generally large. After the source/drain electrode is formed on the semiconductor layer, the semiconductor layer with the large pattern forms a loop around the source/drain electrode, and this part of the semiconductor layer becomes part of a path of a photo-generated current after being irradiated with the light, which aggravates a problem of leakage current. In the four-mask process, the semiconductor layer and the source/drain electrode are formed by a same mask with different forming steps. A metal pattern such as a data line is formed at a same time as the source/drain electrode, and the semiconductor layer is correspondingly formed under the metal pattern. Affected by the process, the semiconductor layer on a side of the metal pattern is exposed, and the exposed semiconductor layer becomes part of the path of the photo-generated current after being irradiated with the light.

Therefore, structures of array substrates need to be improved, so that a problem of a photo-generated leakage current of semiconductor layers in TFTs can be alleviated.

SUMMARY OF APPLICATION

The present application provides a thin-film transistor (TFT) array substrate and a display panel. An active layer located in a peripheral region is distributed in multi-sections, which can improve a photo-generated leakage current of active layer in a TFT.

The present application provides the TFT array substrate including an active layer and a source/drain electrode disposed on the active layer. The active layer includes an electrode coverage region, a channel region, and a first peripheral region disposed around the electrode coverage region and the channel region. The source/drain electrode is disposed corresponding to the electrode coverage region. The active layer located in the first peripheral region is distributed in multi-sections.

In the TFT array substrate provided by an embodiment of the present application, the TFT array substrate further includes a doped layer disposed between the active layer and the source/drain electrode. The doped layer includes a first doped region disposed corresponding to the electrode coverage region and a second doped region disposed corresponding to the first peripheral region. The doped layer located in the second doped region is distributed in multi-sections.

In the TFT array substrate provided by an embodiment of the present application, the doped layer includes any one of a p-type semiconductor or an n-type semiconductor.

In the TFT array substrate provided by an embodiment of the present application, the TFT array substrate further includes a metal wire disposed in a same layer as the source/drain electrode. The active layer further includes a metal wire coverage region covered by the metal wire and a second peripheral region disposed around the metal wire coverage region. The active layer located in the second peripheral region is distributed in multi-sections.

In the TFT array substrate provided by an embodiment of the present application, the TFT array substrate further includes a doped layer disposed between the active layer and the source/drain electrode. The doped layer includes a third doped region disposed corresponding to the electrode coverage region and the metal wire coverage region and a fourth doped region disposed corresponding to the first peripheral region and the second peripheral region. The doped layer located in the fourth doped region is distributed in multi-sections.

In the TFT array substrate provided by an embodiment of the present application, the metal wire includes a data line electrically connected to a source electrode in the source/drain electrode.

In the TFT array substrate provided by an embodiment of the present application, the TFT array substrate further includes a passivation layer disposed on the source/drain electrode and the metal wire, and a pixel electrode disposed on the passivation layer and electrically connected to a drain electrode in the source/drain electrode. The metal wire includes a shared common electrode electrically connected to a source electrode in the source/drain electrode and partially covered by the pixel electrode.

In the TFT array substrate provided by an embodiment of the present application, the TFT array substrate further includes a light-shielding layer disposed on a side of the active layer away from the metal wire and corresponding to the shared common electrode. A projection of the light-shielding layer in a direction perpendicular to the TFT array substrate covers a projection of the active layer located in the metal wire coverage region and the second peripheral region in the direction perpendicular to the TFT array substrate.

In the TFT array substrate provided by an embodiment of the present application, the TFT array substrate further includes a base substrate, and a gate and a gate insulating layer sequentially disposed on the base substrate. The active layer is disposed on the gate insulating layer. An orthographic projection of the gate on the base substrate covers an orthographic projection of the active layer located in the electrode coverage region and the first peripheral region on the base substrate.

In the TFT array substrate provided by an embodiment of the present application, material of the active layer includes any one of amorphous silicon or indium gallium zinc oxide.

In the TFT array substrate provided by an embodiment of the present application, the source/drain electrode includes a source electrode and a drain electrode spaced apart from each other, the electrode coverage region includes a source electrode coverage region and a drain electrode coverage region spaced apart from each other, the source electrode is disposed corresponding to the source electrode coverage region, the drain electrode is disposed corresponding to the drain electrode coverage region, and the source electrode coverage region is connected to the drain electrode coverage region by the channel region.

The present application further provides a display panel including the TFT array substrate and a counter substrate disposed opposite to the TFT array substrate.

The TFT array substrate includes an active layer and a source/drain electrode disposed on the active layer. The active layer includes an electrode coverage region, a channel region, and a first peripheral region disposed around the electrode coverage region and the channel region. The source/drain electrode is disposed corresponding to the electrode coverage region. The active layer located in the first peripheral region is distributed in multi-sections.

In the display panel provided by an embodiment of the present application, the TFT array substrate further includes a doped layer disposed between the active layer and the source/drain electrode. The doped layer includes a first doped region disposed corresponding to the electrode coverage region and a second doped region disposed corresponding to the first peripheral region. The doped layer located in the second doped region is distributed in multi-sections.

In the display panel provided by an embodiment of the present application, the doped layer includes any one of a p-type semiconductor or an n-type semiconductor.

In the display panel provided by an embodiment of the present application, the TFT array substrate further includes a metal wire disposed in a same layer as the source/drain electrode. The active layer further includes a metal wire coverage region covered by the metal wire and a second peripheral region disposed around the metal wire coverage region. The active layer located in the second peripheral region is distributed in multi-sections.

In the display panel provided by an embodiment of the present application, the TFT array substrate further includes a doped layer disposed between the active layer and the source/drain electrode. The doped layer includes a third doped region disposed corresponding to the electrode coverage region and the metal wire coverage region and a fourth doped region disposed corresponding to the first peripheral region and the second peripheral region. The doped layer located in the fourth doped region is distributed in multi-sections.

In the display panel provided by an embodiment of the present application, the metal wire includes a data line electrically connected to a source electrode in the source/drain electrode.

In the display panel provided by an embodiment of the present application, the TFT array substrate further includes a passivation layer disposed on the source/drain electrode and the metal wire, and a pixel electrode disposed on the passivation layer and electrically connected to a drain electrode in the source/drain electrode. The metal wire includes a shared common electrode electrically connected to a source electrode in the source/drain electrode and partially covered by the pixel electrode.

In the display panel provided by an embodiment of the present application, the TFT array substrate further includes a liquid crystal layer disposed between the TFT array substrate and the counter substrate and a color filter disposed on a side of the TFT array substrate near the liquid crystal layer.

In the display panel provided by an embodiment of the present application, the TFT array substrate further includes a liquid crystal layer disposed between the TFT array substrate and the counter substrate and a color filter disposed on a side of the counter substrate near the liquid crystal layer.

In the TFT array substrate provided by an embodiment of the present application, the active layer includes the electrode coverage region and the first peripheral region, the source/drain electrode is disposed on the electrode coverage region, the first peripheral region is disposed around the electrode coverage region, the first peripheral region is not covered by the source/drain electrode, and the active layer located in the first peripheral region is distributed in a discontinuous structure with multi-sections. On one hand, an area of the active layer located in the first peripheral region is reduced, which reduces a number of photo-generated carriers generated by the active layer in the first peripheral region by light irradiation (including backlight and natural light in environment). On the other hand, the active layer in the first peripheral region can be prevented from forming a continuous path of the photo-generated leakage current, which effectively reduces transmission efficiency of the photo-generated carriers on the active layer in the first peripheral region. Therefore, the TFT array substrate provided by the present application can effectively relieve the problem of photo-generated leakage current of the TFT.

DESCRIPTION OF DRAWINGS

The following describes specific embodiments of the present application in detail with reference to the accompanying drawings, which will make technical solutions and other beneficial effects of the present application obvious.

DETAILED DESCRIPTION OF PREFERRED EMBODIMENTS

Figure 1:
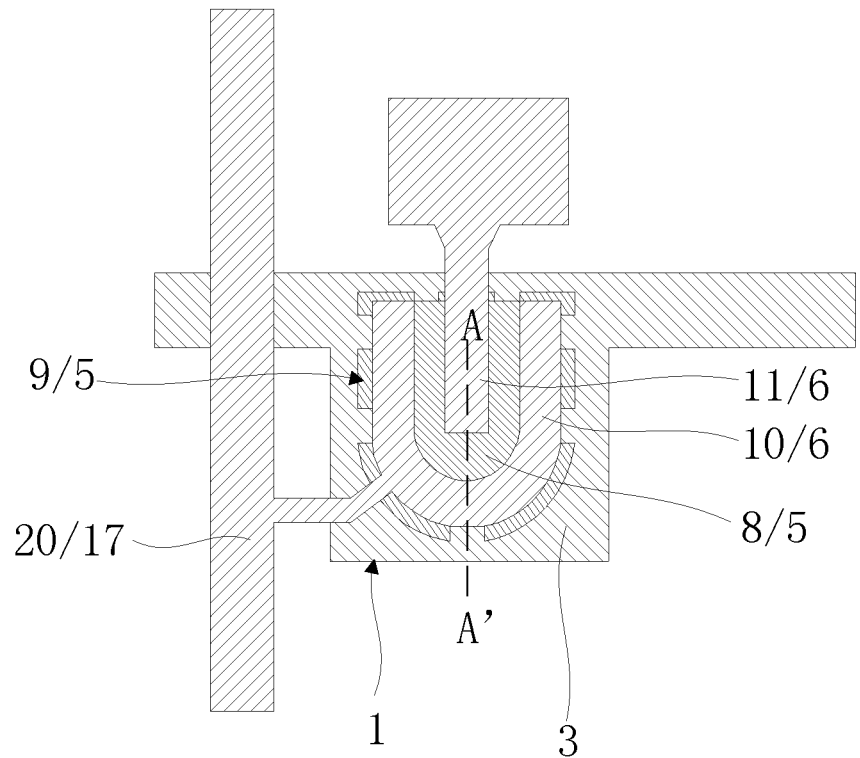
FIG. 1 is a structural diagram of a thin-film transistor (TFT) array substrate according to an embodiment of the present application.

To further explain the technical means and effect of the present application, the following refers to embodiments and drawings for detailed description. Obviously, the described embodiments are only for some embodiments of the present application, instead of all embodiments. Based on the embodiments of the present application, all other embodiments obtained by those skilled in the art without creative work fall into a protection scope of the present application.

Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly include one or more of the features. In the description of the present application, the meaning of "plural" is two or more, unless otherwise specified.

In the present application, unless otherwise specifically stated and defined, terms "connected", "fixed", etc. should be interpreted expansively. For example, "fixed" may be fixed connection, also may be detachable connection, or integration; may be mechanical connection, also may be electrical connection; may be direct connection, also may be indirect connection through an intermediate, and may be internal communication between two elements or interaction of two elements, unless otherwise specifically defined. The ordinary skill in this field can understand the specific implication of the above terms in the present disclosure according to specific conditions.

In the present application, unless otherwise specifically stated and defined, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments or examples are provided here below to implement the different structures of the present application. To simplify the disclosure of the present application, description of the components and arrangements of specific examples is given below. Of course, they are only illustrative and not limiting the present application. Moreover, in the present application, reference numbers and/or letters may be repeated in different embodiments. Such repetition is for the purposes of simplification and clearness, and does not denote the relationship between respective embodiments and/or arrangements being discussed. Furthermore, the present application provides various examples for specific process and materials. However, it is obvious for a person of ordinary skill in the art that other processes and/or materials may alternatively be utilized.

Figure 2:
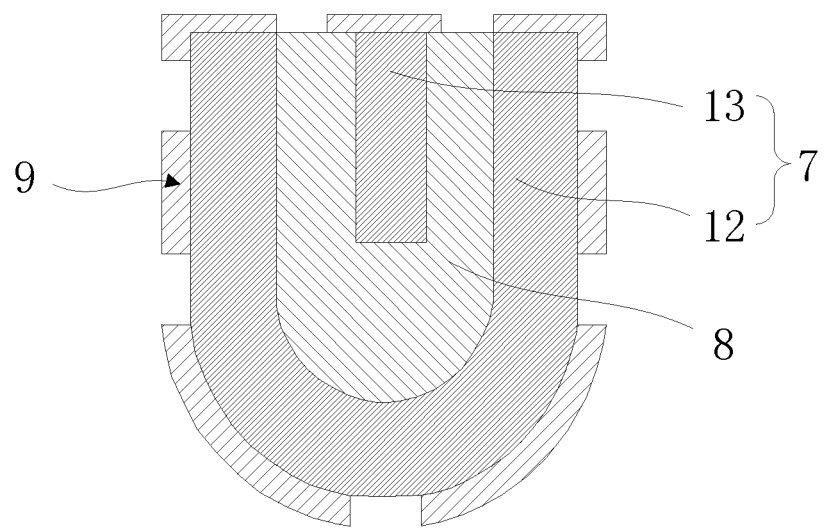
FIG. 2 is a top view diagram of an active layer of a TFT in FIG. 1.
Figure 3:
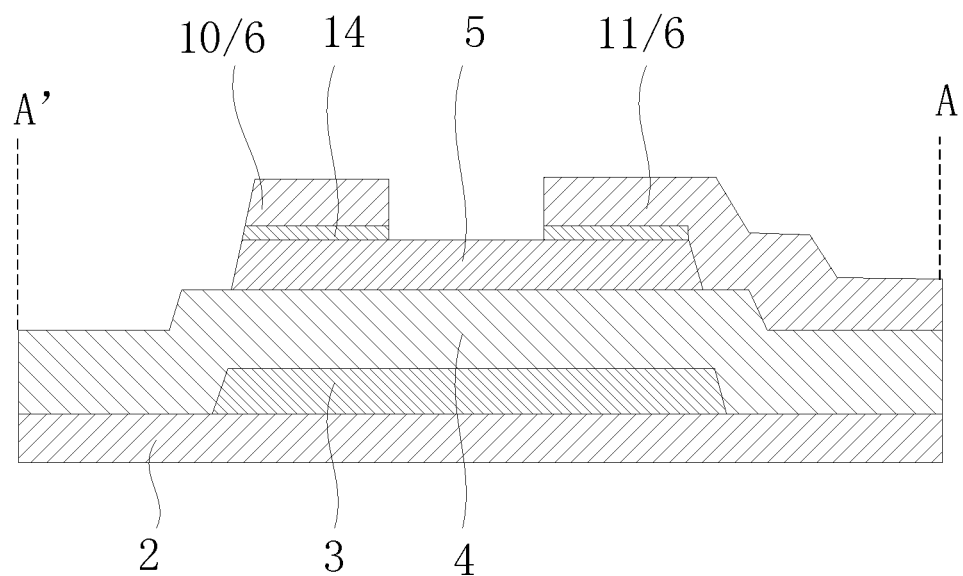
FIG. 3 is a structural diagram of a cross-sectional view A-A' in FIG. 1.

As shown in FIGS. 1 to 3, the present application provides a thin-film transistor (TFT) array substrate 1. The TFT array substrate 1 includes a base substrate 2, and a gate 3, a gate insulating layer 4, an active layer 5, and a source/drain electrode 6 which are sequentially disposed on the base substrate 2. The active layer 5 includes an electrode coverage region 7, a channel region 8, and a first peripheral region 9 disposed around the electrode coverage region 7 and the channel region 8. The source/drain electrode 6 is disposed corresponding to the electrode coverage region 7. The active layer 5 located in the first peripheral region 9 is distributed in multi-sections. The gate 3, the gate insulating layer 4, the active layer 5, and the source/drain electrode 6 constitute a TFT of the TFT array substrate 1. It should be explained that, in this embodiment, the first peripheral region 9 can be completely disposed around the electrode coverage region 7 and the channel region 8, or can be disposed only on a periphery of the electrode coverage region 7, which means that the first peripheral region 9 refers to the active layer 5 not covered by the source/drain electrode 6 except the channel region 8.

Specifically, the active layer 5 located in the first peripheral region 9 is distributed in multi-sections along an edge the electrode coverage region 7 adjacent to the first peripheral region 9, and any two adjacent sections are spaced apart from each other. Shape of each section can be rectangular or other shapes, which is not limited herein.

Specifically, a discontinuous depression or a tortuous design is made on a mask to form a discontinuous multi-sectional active layer 5 located in the first peripheral region 9 when forming a patterned active layer 5.

Material of the active layer 5 includes, but is not limited to, any one of amorphous silicon or indium gallium zinc oxide (IGZO) with strong light sensitivity.

Specifically, the source/drain electrode 6 includes a source electrode 10 and a drain electrode 11 spaced apart from each other. The electrode coverage region 7 includes a source electrode coverage region 12 and a drain electrode coverage region 13 spaced apart from each other. The source electrode 10 is disposed corresponding to the source electrode coverage region 12. The drain electrode 11 is disposed corresponding to the drain electrode coverage region 13. The source electrode coverage region 12 is connected to the drain electrode coverage region 13 by the channel region 8.

Specifically, in this embodiment, the TFT array substrate 1 can be manufactured by a five-mask process. The active layer 5 and the source/drain electrode 6 are separately formed by two different masks.

Specifically, in this embodiment, the TFT array substrate 1 is suitable for a four-domain (one TFT) pixel structure or an eight-domain (three TFTs) pixel structure. Of course, a type of pixel structure suitable for the TFT array substrate 1 is not limited herein.

In this embodiment, the active layer 5 includes the electrode coverage region 7 and the first peripheral region 9, the source/drain electrode 6 is disposed on the electrode coverage region 7, the first peripheral region 9 is disposed around the electrode coverage region 7, the first peripheral region 9 is not covered by the source/drain electrode 6, and the active layer 5 located in the first peripheral region 9 is distributed in a discontinuous structure with multi-sections. On one hand, an area of the active layer 5 located in the first peripheral region 9 is reduced, which reduces a number of photo-generated carriers generated by the active layer 5 in the first peripheral region 9 by light irradiation (including backlight and natural light in environment). On the other hand, the active layer 5 in the first peripheral region 9 can be prevented from forming a continuous path of a photo-generated leakage current, which effectively reduces transmission efficiency of the photo-generated carriers on the active layer 5 in the first peripheral region 9. Therefore, the TFT array substrate 1 provided by the present application can effectively relieve a problem of the photo-generated leakage current of the TFT.

In an embodiment, an orthographic projection of the gate 3 on the base substrate 2 covers an orthographic projection of the active layer 5 located in the electrode coverage region 7 and the first peripheral region 9 on the base substrate 2. In this embodiment, the gate 3 can block light source under the active layer 5 to prevent a lower surface of the active layer 5 from being irradiated with light and generating a photo-generated current.

Figure 4:
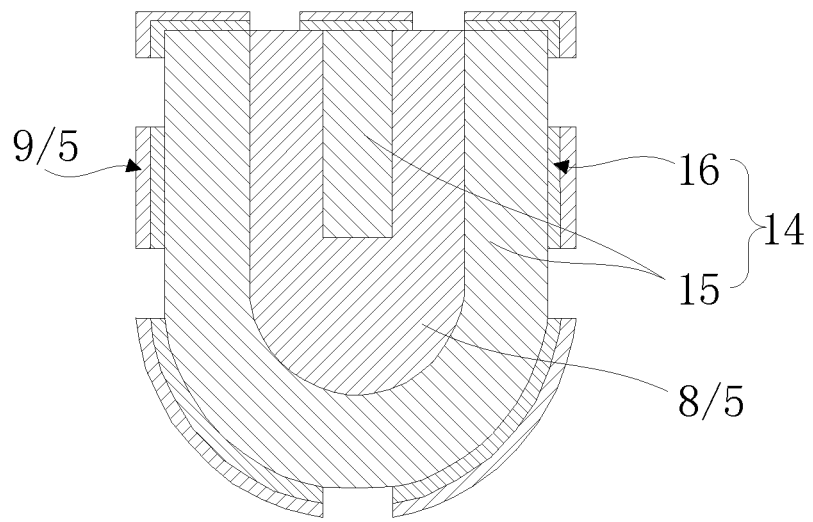
FIG. 4 is a top view diagram of the active layer and a doped layer of the TFT in FIG. 1.

In an embodiment, the TFT array substrate 1 further includes a doped layer 14 disposed between the active layer 5 and the source/drain electrode 6. The doped layer 14 includes a p-type semiconductor or an n-type semiconductor. As shown in FIG. 4, the doped layer 14 includes a first doped region 15 disposed corresponding to the electrode coverage region 7 and a second doped region 16 disposed corresponding to the first peripheral region 9. The doped layer 14 located in the second doped region 16 is distributed in multi-sections.

Specifically, an area of the second doped region 16 is less than or equal to an area of the first peripheral region 9. The doped layers 14 distributed in multi-sections and the active layer 5 distributed in multi-sections are formed in a same process, which means that the doped layers 14 are disposed one-to-one corresponding to the active layer 5 distributed in multi-sections.

In this embodiment, material of the doped layer 14 includes a semiconductor material and a doped material doped in the semiconductor material. The semiconductor material is same as the material of the active layer 5. Accordingly, the doped layer 14 (which is the doped layer 14 located in the second doped region 16) not covered by the source/drain electrode 6 also generates the photo-generated current when irradiated with light. Forming the doped layer 14 located in the second doped region 16 in multi-sections can also reduce the number of photo-generated carriers and the transmission efficiency of the photo-generated carriers, thereby relieving the problem of the photo-generated leakage current of the TFT.

Figure 5:
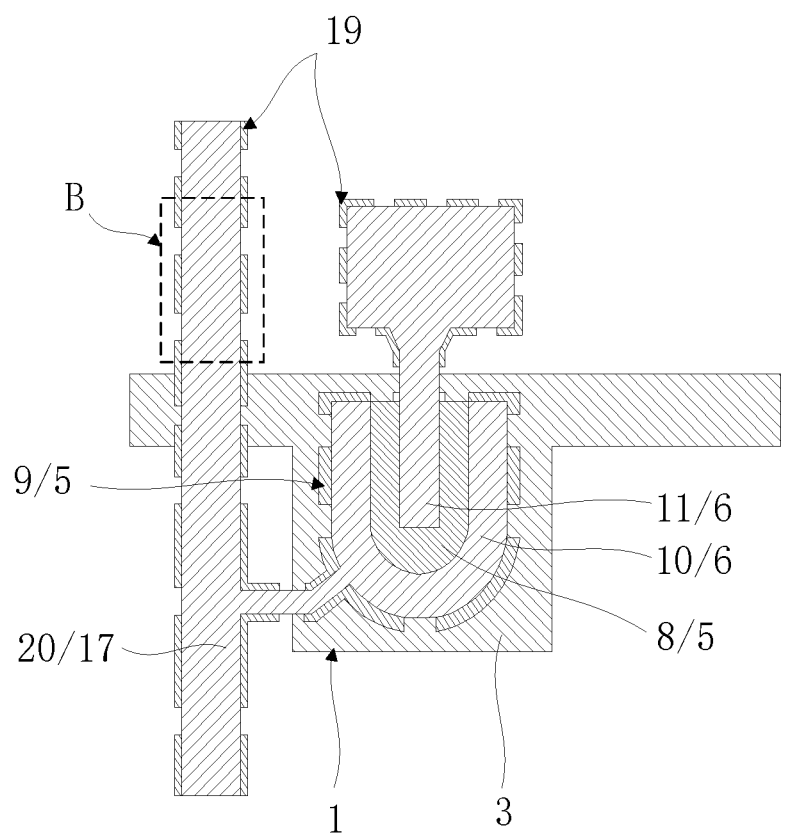
FIG. 5 is another structural diagram of the TFT array substrate according to an embodiment of the present application.
Figure 6:
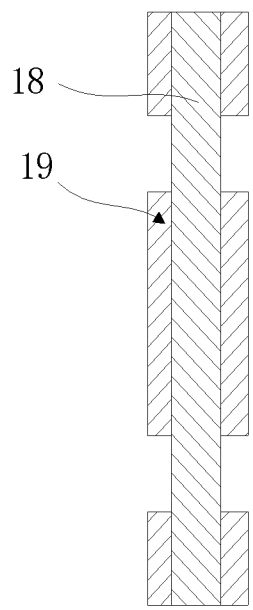
FIG. 6 is a top view diagram of an active layer in a region B in FIG. 5.

As shown in FIGS. 5 and 6, an embodiment of the present application further provides a TFT array substrate 1. The difference from the above embodiments is that the TFT array substrate 1 further includes a metal wire 17 disposed in a same layer as the source/drain electrode 6. Correspondingly, as shown in FIG. 6, the active layer 5 further includes a metal wire coverage region 18 covered by the metal wire 17 and a second peripheral region 19 disposed around the metal wire coverage region 18. The active layer 5 located in the second peripheral region 19 is distributed in multi-sections.

Specifically, in this embodiment, the TFT array substrate 1 can be manufactured by a four-mask process. The active layer 5, the source/drain electrode 6, and the metal wire 17 are formed by a same mask. The metal wire 17 is disposed in the same layer as the source/drain electrode 6 and has a same material as the latter. Understandably, the active layer 5 shown in FIG. 6 is disposed under the metal wire 17 formed with the source/drain electrode 6. The first peripheral region 9 and the second peripheral region 19 of the active layer 5 are tails of the active layer 5 caused by an effect of the patterning process.

Specifically, the metal wire 17 includes a data line 20 electrically connected to a source electrode 10 in the source/drain electrode 6 to provide a signal to the source electrode 10.

In this embodiment, the metal wire 17 includes the first peripheral region 9 not covered by the source/drain electrode 6 and the second peripheral region 19 not covered by the metal wire 17. The active layer 5 located in the first peripheral region 9 and second peripheral region 19 is distributed in a discontinuous structure with multi-sections. On one hand, an area of the active layer 5 located in the first peripheral region 9 and the second peripheral region 19 is reduced, which reduces a number of photo-generated carriers generated by the active layer 5 in the first peripheral region 9 and the second peripheral region 19 by light irradiation (including backlight and natural light in environment). On the other hand, the active layer 5 in the first peripheral region 9 and the second peripheral region 19 can be prevented from forming the continuous path of the photo-generated leakage current, which effectively reduces transmission efficiency of the photo-generated carriers on the active layer 5 in the first peripheral region 9 and the second peripheral region 19. Therefore, the TFT array substrate 1 provided by the present application can effectively relieve the problem of the photo-generated leakage current of the TFT and a position of the metal wire 17.

Figure 7:
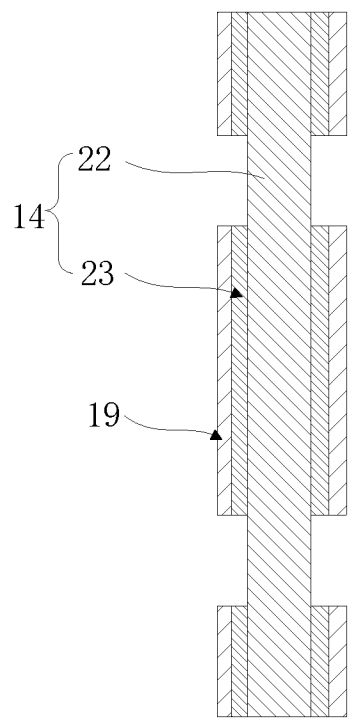
FIG. 7 is a top view diagram of the active layer and a doped layer in the region B in FIG. 5.
Figure 8:
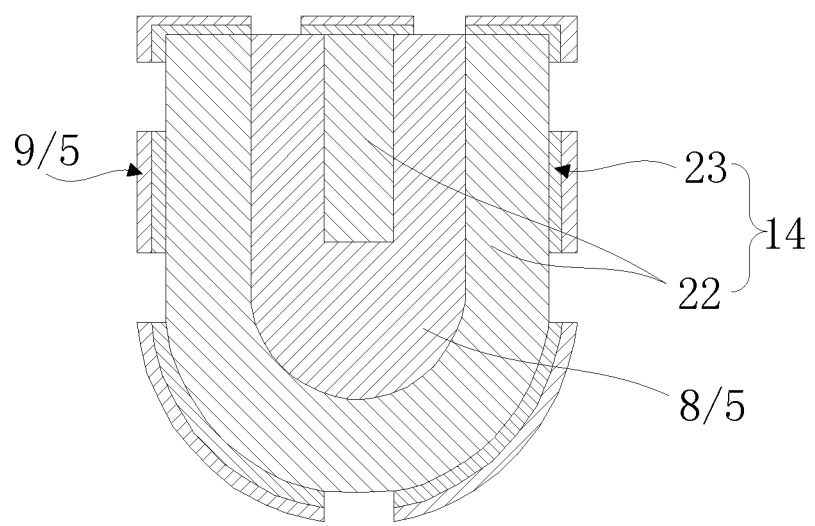
FIG. 8 is a top view diagram of the active layer and the doped layer of the TFT in FIG. 1.

In an embodiment, the TFT array substrate 1 further includes a doped layer 14 disposed between the active layer 5 and the source/drain electrode 6. As shown in FIGS. 7 and 8, the doped layer 14 includes a third doped region 22 disposed corresponding to the electrode coverage region 7 and the metal wire coverage region 18 and a fourth doped region 23 disposed corresponding to the first peripheral region 9 and the second peripheral region 19. The doped layer 14 located in the fourth doped region 23 is distributed in multi-sections.

Specifically, the doped layers 14 distributed in multi-sections and the active layer 5 distributed in multi-sections are formed in a same process, which means that the doped layers 14 are disposed one-to-one corresponding to the active layer 5 distributed in multi-sections.

In this embodiment, material of the doped layer 14 includes a semiconductor material and a doped material doped in the semiconductor material. The semiconductor material is same as the material of the active layer 5. Accordingly, the doped layer 14 located in the fourth doped region 23 (which is the doped layer 14 not covered by the source/drain electrode 6 and the metal wire 17) also generates the photo-generated current when irradiated with light. Forming the doped layer 14 located in the fourth doped region 23 in multi-sections can also reduce the number of photo-generated carriers and the transmission efficiency of the photo-generated carriers, thereby relieving the problem of the photo-generated leakage current of the TFT and a position of the metal wire 17.

Figure 9:
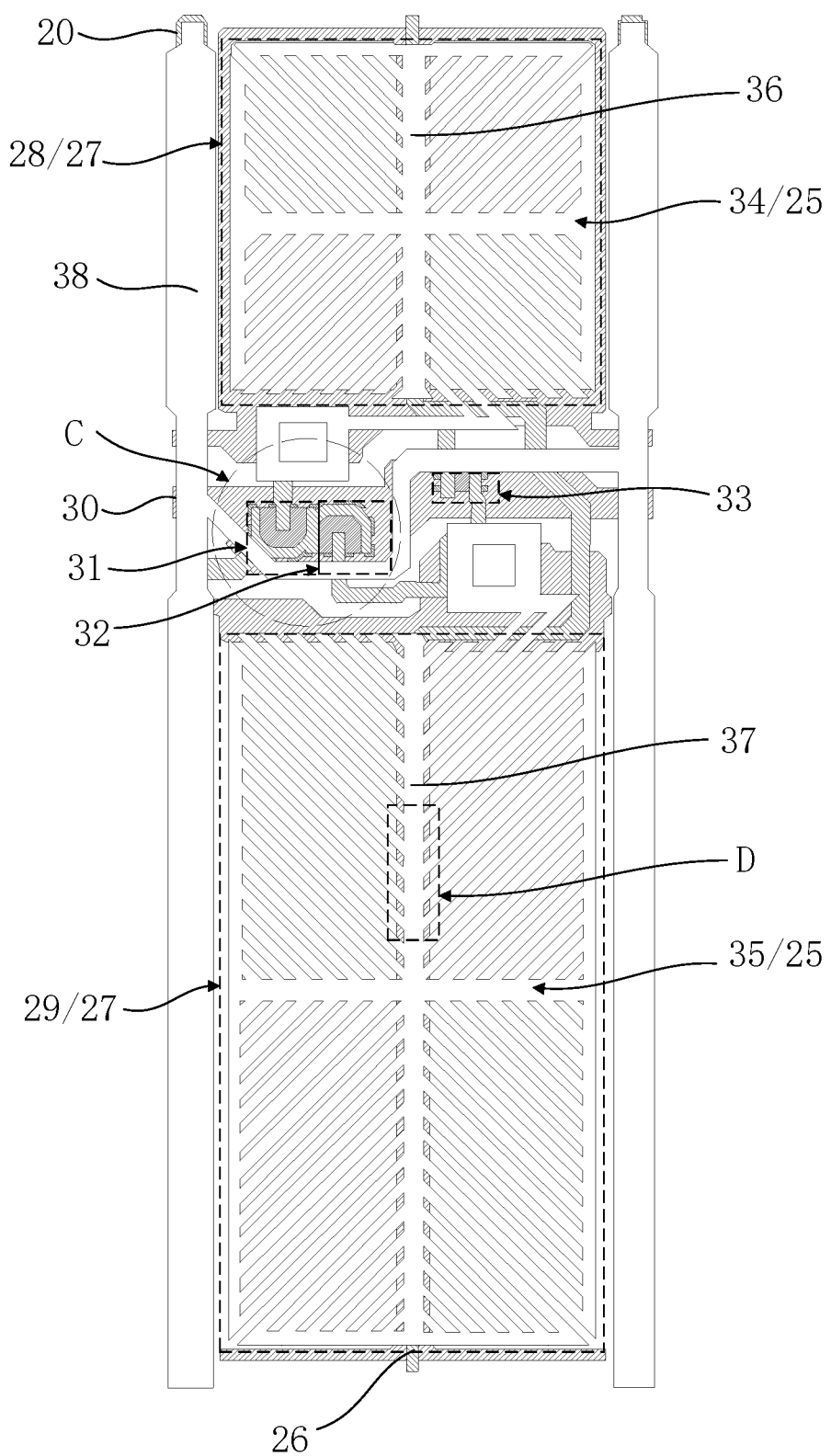
FIG. 9 is another structural diagram of the TFT array substrate according to an embodiment of the present application.
Figure 10:
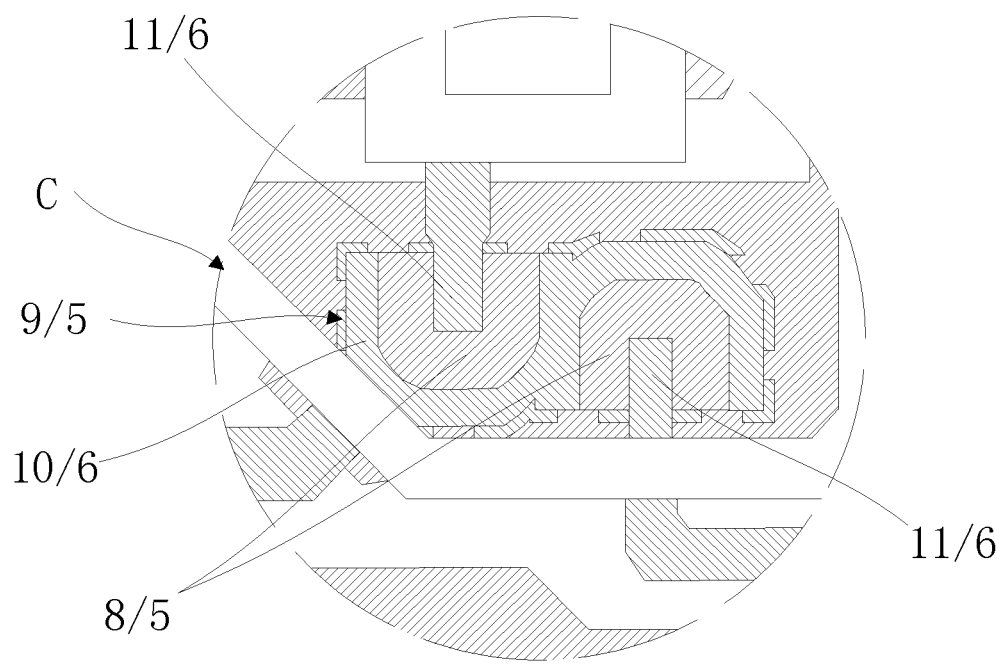
FIG. 10 is an enlarged view diagram of a region C in FIG. 9.

As shown in FIGS. 9 and 10, an embodiment of the present application further provides a TFT array substrate 1 having a pixel structure of an eight-domain (three TFTs). The difference from the above embodiments is that the TFT array substrate 1 is formed with a plurality of sub-pixels 27 disposed on an array. Each of the plurality of sub-pixels 27 includes a main-region and a sub-region. The TFT array substrate 1 is provided with a scan line 30 corresponding to each row of the plurality of sub-pixels 27. The scan line 30 is disposed between the main-region 28 and the sub-region 29, and a data line 20 (which is the metal wire 17 formed in a same layer as the source/drain electrode 11) is disposed corresponding to each column of the plurality of sub-pixels 27. The TFT array substrate 1 further includes a main-region TFT 31, a sub-region TFT 32, and a shared TFT 33, which are disposed corresponding to each of the plurality of sub-pixels 27. Each TFT is constituted by a gate 3, a gate insulating layer 4, an active layer 5, and a source/drain electrode 6. The first peripheral region 9 not covered by the source/drain electrode 6 in the active layer 5 is distributed in multi-sections.

Specifically, the TFT array substrate 1 further includes a passivation layer (the passivation layer, not shown in FIG. 9, is generally transparent and can refer to the passivation layer 24 in FIG. 12) disposed on the source/drain electrode 6 and the data line 20, and a pixel electrode 25 disposed on the passivation layer and electrically connected (which can be implement by disposing a through hole on the passivation layer) to a drain electrode 11 in the source/drain electrode 6. The TFT array substrate 1 further includes a shared common electrode 26 electrically connected to a source electrode 10 in the source/drain electrode 6 and at least partially covered by the pixel electrode 25. The shared common electrode 26, the data line 20, and the source/drain electrode 6 are formed by a same process and have a same material. Therefore, the shared common electrode 26 and the data line 20 belong to the metal trace 17.

Specifically, the pixel electrode 25 includes a main-region pixel electrode 34 disposed corresponding to the main-region 28 and a sub-region pixel electrode 35 disposed corresponding to the sub-region 29. A gate of the main-region TFT 31, a gate of the sub-region TFT 32, and a gate of the shared TFT 33 are connected to a same scan line 30. A source electrode of the main-region TFT 31 and a source electrode of the sub-region TFT 32 are connected to a same scan line 30. A drain electrode of the main-region TFT 31 is connected to (connected by the through hole on the passivation layer) the main-region pixel electrode 34. A drain electrode of the sub-region TFT 32 and a drain electrode of the shared TFT 33 are connected to the sub-region pixel electrode 35. A source electrode of the shared TFT 33 is connected to the shared common electrode 26.

Specifically, the main-region pixel electrode 34 includes a main-region horizontal pixel trunk, a main-region vertical pixel trunk, and a main-region pixel branch. The sub-region pixel electrode 35 includes a sub-region horizontal pixel trunk, a sub-region vertical pixel trunk, and a sub-region pixel branch. The main-region horizontal pixel trunk of the main-region pixel electrode 34 and the main-region vertical pixel trunk intersect perpendicularly. The main-region horizontal pixel trunk and the main-region vertical pixel trunk intersect perpendicularly to equally form four main-region pixel display regions. Each of the main-region pixel display regions includes a plurality of main-region pixel branches disposed in parallel and spaced apart from each other. Two ends of each of the plurality of main-region pixel branches are respectively connected to the main-region horizontal pixel trunk and the main-region vertical pixel trunk. An angle between the plurality of main-region pixel branches and the main-region horizontal pixel trunk and the main-region vertical pixel trunk is an acute angle (e.g., 45 degrees). Similarly, the sub-region horizontal pixel trunk of the sub-region pixel electrode 35 and the sub-region vertical pixel trunk intersect perpendicularly. The sub-region hori- zontal pixel trunk and the sub-region vertical pixel trunk intersect perpendicularly to equally form four sub-region pixel display regions. Each of the sub-region pixel display regions includes a plurality of sub-region pixel branches disposed in parallel and spaced apart from each other. Two ends of each of the plurality of sub-region pixel branches are respectively connected to the sub-region horizontal pixel trunk and the sub-region vertical pixel trunk. An angle between the plurality of sub-region pixel branches and the sub-region horizontal pixel trunk and the sub-region vertical pixel trunk is an acute angle. The main-region vertical pixel trunk includes a main-region vertical frame trunk near the data line 20 and a main-region vertical center trunk 36 located in a center cross of the main-region pixel electrode 34. The sub-region vertical pixel trunk includes a sub-region vertical frame trunk near the data line 20 and a sub-region vertical center trunk 37 located in a center cross of the sub-region pixel electrode 35.

Specifically, the shared common electrode 26 is at least partially covered by the main-region vertical center trunk 36 and the sub-region vertical center trunk 37.

Specifically, the TFT array substrate 1 further includes a DBS (i.e., data BM saving, data line without black matrix) common electrode 38 disposed in a same layer as the pixel electrode 25 and corresponding to the data line 20. The DBS common electrode 38 shields the data line 20 by an electric field. Materials of the DBS common electrode 38 and the pixel electrode 25 include indium tin oxide (ITO).

Figure 11:
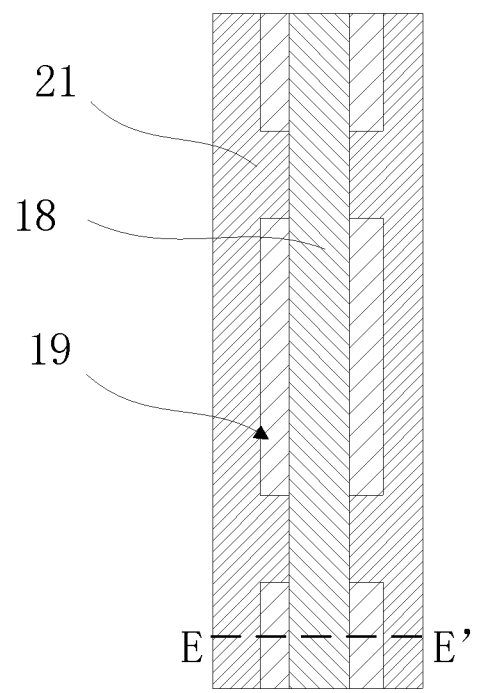
FIG. 11 is a structural diagram of a metal wire, the active layer, and a light-shielding layer in a region D in FIG. 9.
Figure 12:
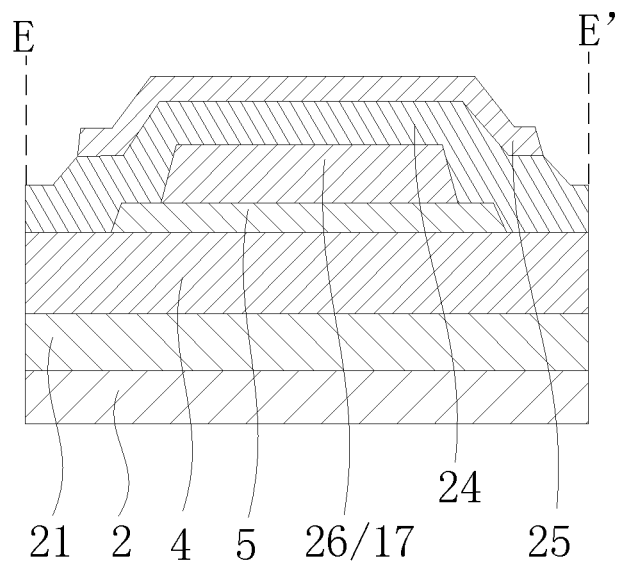
FIG. 12 is a structural diagram of a cross-sectional view E-E' in FIG. 11.

In an embodiment, as shown in FIGS. 11 and 12, the active layer is disposed under the data line 20 and the shared common electrode 26, and this part of the active layer 5 includes a metal wire coverage region 18 and a second peripheral region 19. The data line 20 and the shared common electrode 26 are disposed in the metal wire coverage region 18. The active layer 5 located in the second peripheral region 19 is distributed in multi-sections.

It should be explained that FIG. 10 only shows that a periphery (specifically, the first peripheral region 9) of the active layer 5 corresponding to the source/drain electrode 6 is distributed in multi-sections, but a situation in which the active layer 5 is also disposed under the metal trace 17 including the data line 20 and the shared common electrode 26 is not excluded. If the active layer 5 is disposed under the metal trace 17, this means that the active layer 5 further includes the metal wire coverage region 18 and the second peripheral region 19, and the active layer 5 located in the second peripheral region 19 is also distributed in multi-sections. FIGS. 11 and 12 are structural diagrams of multi-sections of a periphery (specifically, the second peripheral region 19) of the active layer 5 corresponding to the shared common electrode 26. Understandably, when the periphery (specifically, the second peripheral region 19) of the active layer 5 corresponding to the shared common electrode 26 is distributed in multi-sections, the periphery (specifically, the second peripheral region 19) of the active layer 5 corresponding to data line 20 is distributed in multi-sections as well (not shown).

In an embodiment, the TFT array substrate 1 further includes a light-shielding layer 21 disposed corresponding to the shared common electrode 26. The light-shielding layer 21 is disposed on a side of the active layer 5 away from the shared common electrode 26. A projection of the light-shielding layer 21 in a direction perpendicular to the TFT array substrate 1 (which is an orthographic projection on the base substrate 2) covers a projection of the active layer 5 located in the metal wire coverage region 18 and the second peripheral region 19 in the direction perpendicular to the TFT array substrate 1. The light-shielding layer 21 and the gate 3 are formed by a same process and have a same material. The light-shielding layer 21 can block light source under the metal wire coverage region 18 and the active layer 5 of the second peripheral region 19 to prevent a lower surface of the metal wire coverage region 18 and the active layer 5 of the second peripheral region 19 from being irradiated with light and generating a photo-generated current.

In this embodiment, the shared common electrode 26 with a specific electric potential is connected to the source 10 of the shared TFT 33, and a voltage difference between the sub-region pixel electrode 35 and an upper-board common electrode can be adjusted to reduce a difference between the voltage difference between the sub-region pixel electrode 35 and the upper-board common electrode and a voltage difference between the main-region pixel electrode 34 and the upper-board common electrode. The shared common electrode 26, data line 20, source/drain electrode 6, and the active layer 5 are formed by a same mask. The metal wire 17 includes the first peripheral region 9 not covered by the source/drain electrode 6 and the second peripheral region 19 not covered by the metal wire 17. The active layer 5 located in the first peripheral region 9 and second peripheral region 19 is distributed in a discontinuous structure with multi-sections. On one hand, an area of the active layer 5 located in the first peripheral region 9 and the second peripheral region 19 is reduced, which reduces a number of photo-generated carriers generated by the active layer 5 in the first peripheral region 9 and the second peripheral region 19 by light irradiation (including backlight and natural light in environment). On the other hand, the active layer 5 in the first peripheral region 9 and the second peripheral region 19 can be prevented from forming the continuous path of the photo-generated leakage current, which effectively reduces transmission efficiency of the photo-generated carriers on the active layer 5 in the first peripheral region 9 and the second peripheral region 19. Therefore, the TFT array substrate 1 provided by the present application can effectively relieve the problem of the photo-generated leakage current of the TFT and a position of the metal wire 17.

Figure 13:
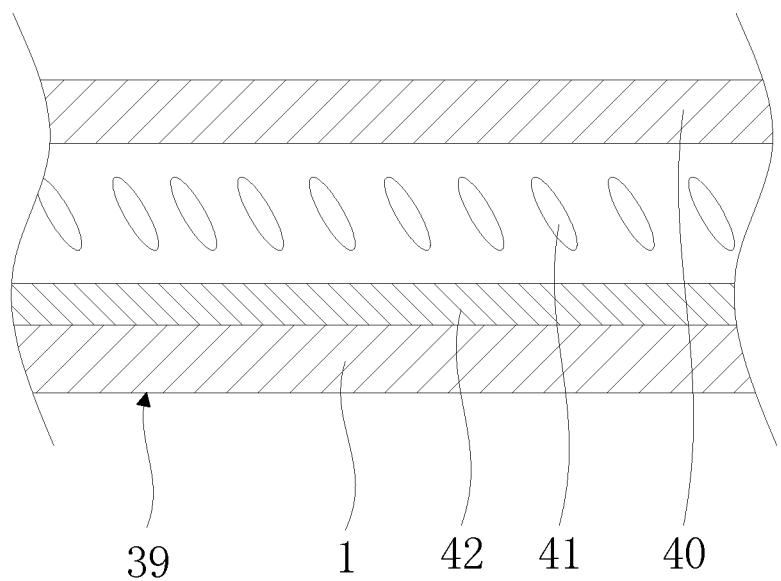
FIG. 13 is a partial view diagram of a display panel according to an embodiment of the present application.

As shown in FIG. 13, an embodiment of the present application further provides a display panel 39. The display panel 39 includes the TFT array substrate 1 of the above embodiments, a counter substrate 40 disposed opposite to the TFT array substrate 1, and a liquid crystal layer 41 disposed between the TFT array substrate 1 and the counter substrate 40.

Specifically, the display panel 39 further includes a color filter 42. The color filter 42 can be disposed on a side of the TFT array substrate 1 near the liquid crystal layer 41 and can also be disposed on a side of the counter substrate 40 near the liquid crystal layer 41, which is not limited herein.

Of course, the display panel 39 can also be an organic light-emitting diode (OLED) display panel, and an organic light-emitting functional layer is disposed between the TFT array substrate 1 and the counter substrate 40.

In this embodiment, the TFT array substrate 1 of the display panel 39 can be manufactured by the four-mask process or the five-mask process. If the TFT array substrate 1 is manufactured by the five-mask process, the active layer 5 of the obtained TFT array substrate 1 includes a first peripheral region 9 not covered by the source/drain electrode 6, and the active layer 5 located in the first peripheral region 9 is distributed in a discontinuous structure with multi-sections. On one hand, an area of the active layer 5 located in the first peripheral region 9 is reduced, which reduces a number of photo-generated carriers generated by the active layer 5 in the first peripheral region 9 by light irradiation (including backlight and natural light in environment). On the other hand, the active layer 5 in the first peripheral region 9 can be prevented from forming the continuous path of the photo-generated leakage current, which effectively reduces transmission efficiency of the photo-generated carriers on the active layer 5 in the first peripheral region 9. If the TFT array substrate 1 is manufactured by the four-mask process, one mask can be saved, but the active layer 5 of the obtained TFT array substrate 1 includes the first peripheral region 9 not covered by the source/drain electrode 6 and the second peripheral region 19 not covered by the metal wire 17, and the active layer 5 located in the first peripheral region 9 and the second peripheral region 19 is distributed in a discontinuous structure with multi-sections. On one hand, an area of the active layer 5 located in the first peripheral region 9 and the second peripheral region 19 is reduced, which reduces a number of photo-generated carriers generated by the active layer 5 in the first peripheral region 9 and the second peripheral region 19 by light irradiation (including backlight and natural light in environment). On the other hand, the active layer 5 in the first peripheral region 9 and the second peripheral region 19 can be prevented from forming the continuous path of the photo-generated leakage current, which effectively reduces transmission efficiency of the photo-generated carriers on the active layer 5 in the first peripheral region 9 and the second peripheral region 19. Therefore, the TFT array substrate 1 provided by the present application is manufactured by either the four-mask process or the five-mask process can effectively relieve the problem of the photo-generated leakage current of the TFT and a position of the metal wire 17.

In the above embodiments, the description of each embodiment has its own emphasis. For a part that is not described in detail in one embodiment, reference may be made to related descriptions in other embodiments.

Although the present application has been disclosed above by the preferred embodiments, the preferred embodiments are not intended to limit the application. One of ordinary skill in the art, without departing from the spirit and scope of the present application, can make various modifications and variations of the present application. Therefore, the scope of the claims to define the scope of equivalents.

What is claimed is:
1. A thin-film transistor (TFT) array substrate, comprising:
    an active layer and a source/drain electrode disposed on the active layer;
    wherein the active layer comprises an electrode coverage region, a channel region, and a first peripheral region disposed around the electrode coverage region and the channel region;
    wherein the source/drain electrode is disposed corresponding to the electrode coverage region; and
    wherein the active layer located in the first peripheral region is distributed in multi-sections.
2. The TFT array substrate as claimed in claim 1, further comprising a doped layer disposed between the active layer and the source/drain electrode;
    wherein the doped layer comprises a first doped region disposed corresponding to the electrode coverage region and a second doped region disposed corresponding to the first peripheral region; and
    wherein the doped layer located in the second doped region is distributed in multi-sections.

3. The TFT array substrate as claimed in claim 2, wherein the doped layer comprises any one of a p-type semiconductor or an n-type semiconductor.

4. The TFT array substrate as claimed in claim 1, further comprising a metal wire disposed in a same layer as the source/drain electrode;
wherein the active layer further comprises a metal wire coverage region covered by the metal wire and a second peripheral region disposed around the metal wire coverage region; and
wherein the active layer located in the second peripheral region is distributed in multi-sections.

5. The TFT array substrate as claimed in claim 4, further comprising a doped layer disposed between the active layer and the source/drain electrode;
wherein the doped layer comprises a third doped region disposed corresponding to the electrode coverage region and the metal wire coverage region and a fourth doped region disposed corresponding to the first peripheral region and the second peripheral region;
wherein the doped layer located in the fourth doped region is distributed in multi-sections.

6. The TFT array substrate as claimed in claim 4, wherein the metal wire comprises a data line electrically connected to a source electrode in the source/drain electrode.

7. The TFT array substrate as claimed in claim 4, further comprising a passivation layer disposed on the source/drain electrode and the metal wire, and a pixel electrode disposed on the passivation layer and electrically connected to a drain electrode in the source/drain electrode;
wherein the metal wire comprises a shared common electrode electrically connected to a source electrode in the source/drain electrode and partially covered by the pixel electrode.

8. The TFT array substrate as claimed in claim 7, further comprising a light-shielding layer disposed on a side of the active layer away from the metal wire and corresponding to the shared common electrode;
wherein a projection of the light-shielding layer in a direction perpendicular to the TFT array substrate covers a projection of the active layer located in the metal wire coverage region and the second peripheral region in the direction perpendicular to the TFT array substrate.

9. The TFT array substrate as claimed in claim 1, further comprising a base substrate, and a gate and a gate insulating layer sequentially disposed on the base substrate;
wherein the active layer is disposed on the gate insulating layer; and
wherein an orthographic projection of the gate on the base substrate covers an orthographic projection of the active layer located in the electrode coverage region and the first peripheral region on the base substrate.

10. The TFT array substrate as claimed in claim 1, wherein material of the active layer comprises any one of amorphous silicon or indium gallium zinc oxide.

11. The TFT array substrate as claimed in claim 1, wherein the source/drain electrode comprises a source electrode and a drain electrode spaced apart from each other, the electrode coverage region comprises a source electrode coverage region and a drain electrode coverage region spaced apart from each other, the source electrode is disposed corresponding to the source electrode coverage region, the drain electrode is disposed corresponding to the drain electrode coverage region, and the source electrode coverage region is connected to the drain electrode coverage region by the channel region.

12. A display panel, comprising the TFT array substrate as claimed in claim 1 and a counter substrate disposed opposite to the TFT array substrate.

13. The display panel as claimed in claim 12, further comprising a doped layer disposed between the active layer and the source/drain electrode;
wherein the doped layer comprises a first doped region disposed corresponding to the electrode coverage region and a second doped region disposed corresponding to the first peripheral region; and
wherein the doped layer located in the second doped region is distributed in multi-sections.

14. The display panel as claimed in claim 13, wherein the doped layer comprises any one of a p-type semiconductor or an n-type semiconductor.

15. The display panel as claimed in claim 12, further comprising a metal wire disposed in a same layer as the source/drain electrode;
wherein the active layer further comprises a metal wire coverage region covered by the metal wire and a second peripheral region disposed around the metal wire coverage region; and
wherein the active layer located in the second peripheral region is distributed in multi-sections.

16. The display panel as claimed in claim 15, further comprising a doped layer disposed between the active layer and the source/drain electrode;
wherein the doped layer comprises a third doped region disposed corresponding to the electrode coverage region and the metal wire coverage region and a fourth doped region disposed corresponding to the first peripheral region and the second peripheral region;
wherein the doped layer located in the fourth doped region is distributed in multi-sections.

17. The display panel as claimed in claim 15, wherein the metal wire comprises a data line electrically connected to a source electrode in the source/drain electrode.

18. The display panel as claimed in claim 15, further comprising a passivation layer disposed on the source/drain electrode and the metal wire, and a pixel electrode disposed on the passivation layer and electrically connected to a drain electrode in the source/drain electrode;
wherein the metal wire comprises a shared common electrode electrically connected to a source electrode in the source/drain electrode and partially covered by the pixel electrode.

19. The display panel as claimed in claim 12, further comprising a liquid crystal layer disposed between the TFT array substrate and the counter substrate and a color filter disposed on a side of the TFT array substrate near the liquid crystal layer.

20. The display panel as claimed in claim 12, further comprising a liquid crystal layer disposed between the TFT array substrate and the counter substrate and a color filter disposed on a side of the counter substrate near the liquid crystal layer.

* * * * *